(12) United States Patent
Zhang

(10) Patent No.: US 10,066,289 B2
(45) Date of Patent: Sep. 4, 2018

(54) EVAPORATION CRUCIBLE AND EVAPORATION DEVICE

(71) Applicant: BOE TECHNOLOGY GROUP CO., LTD., Beijing (CN)

(72) Inventor: Yongfeng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 280 days.

(21) Appl. No.: 15/200,055

(22) Filed: Jul. 1, 2016

(65) Prior Publication Data

US 2017/0067146 A1    Mar. 9, 2017

(30) Foreign Application Priority Data

Sep. 8, 2015 (CN) .......................... 2015 1 0566774

(51) Int. Cl.
*C23C 16/00* (2006.01)
*C23C 14/24* (2006.01)
*C23C 14/22* (2006.01)

(52) U.S. Cl.
CPC .......... *C23C 14/243* (2013.01); *C23C 14/228* (2013.01)

(58) Field of Classification Search
CPC ........................... C23C 14/243; C23C 14/228
USPC ......................................................... 118/726
See application file for complete search history.

(56) References Cited

U.S. PATENT DOCUMENTS

| 4,061,800 A | * | 12/1977 | Anderson | ............ C23C 14/228 118/726 |
| 4,147,573 A | * | 4/1979 | Morimoto | ............ C23C 14/221 117/103 |
| 2013/0160710 A1 | * | 6/2013 | Pei | ...................... H01J 37/3244 118/723 E |

FOREIGN PATENT DOCUMENTS

| CN | 1940123 A | 4/2007 |
| JP | S6199670 A | 5/1986 |
| JP | 2014109050 A | 6/2014 |

OTHER PUBLICATIONS

First Chinese Office Action dated May 4, 2017.

* cited by examiner

*Primary Examiner* — Keath T Chen
(74) *Attorney, Agent, or Firm* — Dilworth & Barrese, LLP.; Michael J. Musella, Esq.

(57) ABSTRACT

Embodiments of the present disclosure provide an evaporation crucible and an evaporation device. The evaporation crucible includes a crucible body and a fluid guide member communicated with the crucible body, and a plurality of gas inlet nozzles being distributed on a side wall of the fluid guide member.

15 Claims, 4 Drawing Sheets

EVAPORATION CRUCIBLE AND EVAPORATION DEVICE

TECHNICAL FIELD

Embodiments of the present disclosure relate to an evaporation crucible and an evaporation device.

BACKGROUND

An Organic Light-Emitting Diode (OLED) display screen has been put in the list of next generation display technologies which have wide development prospects, due to advantages such as thinness, lightness, wide viewing angle, active light emitting, continuous and adjustable light-emitting color, low cost, fast response speed, low energy consumption, low driving voltage, wide working temperature range, simple production process, high light-emitting efficiency, and flexible display and so on.

An OLED device is generally formed on a substrate by an evaporation process, which refers to that an evaporation material is heated under a certain vacuum condition, the evaporation material is melted (or sublimated) into vapor composed of atoms, molecules or atomic groups, then the vapor is congealed on a surface of the substrate to form a film, so as to form a functional layer of the OLED device. The evaporation process can be divided into point source evaporation and line source evaporation according to types of an evaporation source (a heating device of the evaporation material). The development of point source evaporation technology is relatively mature, and mass production has been achieved on a production line.

The evaporation material is expensive and low in utilizing rate, because a path for evaporation gas molecules to overflow from a crucible to the substrate in a high-vacuum environment is long. Thus, a proportion of evaporation gas molecules flying to the surface of the substrate and deposited on the surface of the substrate is not greater than 5%, and most of the evaporation material is deposited on inner wall of a cavity, which, on one hand, pollutes the cavity, and on the other hand, affects a vacuum degree of the cavity.

SUMMARY

An embodiment of the present disclosure provides an evaporation crucible, including: a crucible body and a fluid guide member communicated with the crucible body, and a plurality of gas inlet nozzles being distributed on a side wall of the fluid guide member.

Another embodiment of the present disclosure provides an evaporation device, including: an evaporation cavity, the evaporation crucible according to claim 1 which is located in the evaporation cavity, and an inert gas tank located outside the evaporation cavity, wherein, the inert gas tank is communicated with the plurality of inert gas inlet nozzles of the evaporation crucible through a gas pipeline.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

The technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiments of the present disclosure provide an evaporation crucible and an evaporation device, for example, in order to improve a material utilizing rate and evaporation efficiency.

Figure 1:
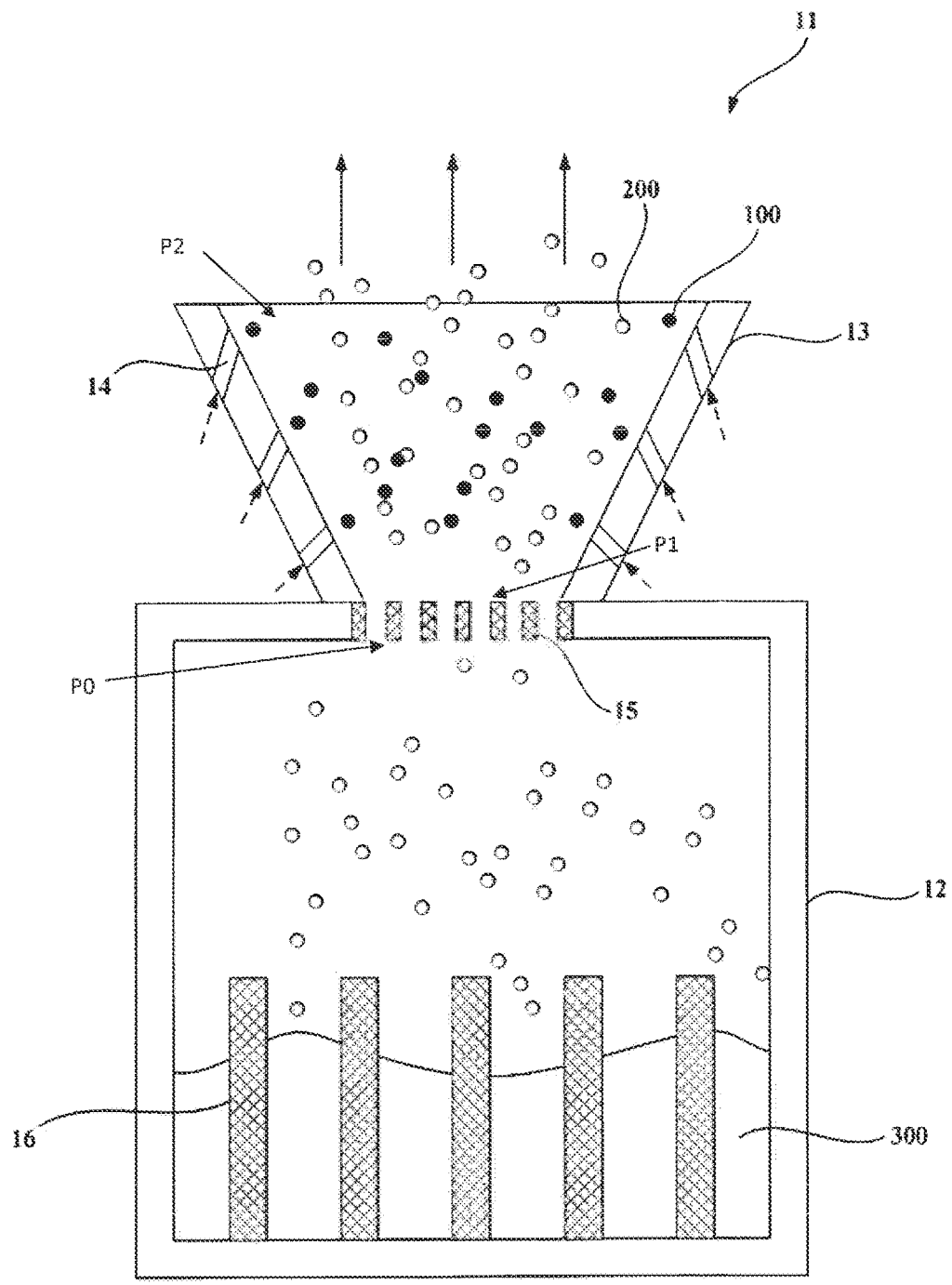
FIG. 1 is a schematic diagram of a longitudinal section of an evaporation crucible in an embodiment of the present disclosure.

As shown in FIG. 1, an evaporation crucible 11 provided by an embodiment of the present disclosure comprises a crucible body 12 and a fluid guide member 13 communicated with the crucible body 12. A plurality of gas inlet nozzles 14 are distributed on a side wall of the fluid guide member 13. The plurality of gas inlet nozzles 14 are configured to introduce gas into the fluid guide member 13. For example, in the embodiment, the plurality of gas inlet nozzles 14 are configured to introduce inert gas into the fluid guide member 13, and therefore the gas inlet nozzles 14 are also called inert gas inlet nozzles 14.

In a technical solution of the embodiment of the present disclosure, the plurality of inert gas inlet nozzles 14 are arranged on the side wall of the fluid guide member 13. When the evaporation crucible 11 is applied to an evaporation device, inert gas is introduced into the fluid guide member 13 through the plurality of inert gas inlet nozzles 14, inert gas molecules 100 can collide with evaporation gas molecules 200 in the fluid guide member 13. Therefore kinetic energy for the evaporation gas molecules 200 to move upwards can be increased, and evaporation gas molecules flying to a surface of a substrate and deposited on the surface of the substrate are greatly increased. By means of this solution, the evaporation material utilizing rate can be improved, and the evaporation efficiency can be improved.

A shape of the fluid guide member 13 is not specifically limited. In the embodiment shown in FIG. 1, the crucible body 12 has a body opening P0 on a top thereof; the fluid guide member 13 is in a shape of a funnel, and has a first opening P1 on a bottom thereof and a second opening P2 on a top thereof. The second opening P2 is greater than the first opening P1. The first opening P1 of the fluid guide member 13 is connected with the crucible body 12 at the body opening P0. Thus, a movement direction of the evaporation gas molecules 200 can be controlled easily, so as to increase a possibility that the evaporation gas molecules 200 moves to the substrate, thereby further improving the evaporation material utilizing rate.

The number of the inert gas inlet nozzles 14 is not limited and can be designed according to the size of the fluid guide member 13. For example, the plurality of inert inlet spray nozzles 14 are obliquely upwards point to the top of the fluid guide member 13. By means of this solution, gas flow of the inert gas introduced into the fluid guide member 13 can have a good performance on boosting the evaporation gas molecules 200, and therefore more evaporation gas molecules 200 can fast reach the surface of the substrate and be deposited on the surface of the substrate so that the evaporation efficiency can be further improved.

Figure 2:
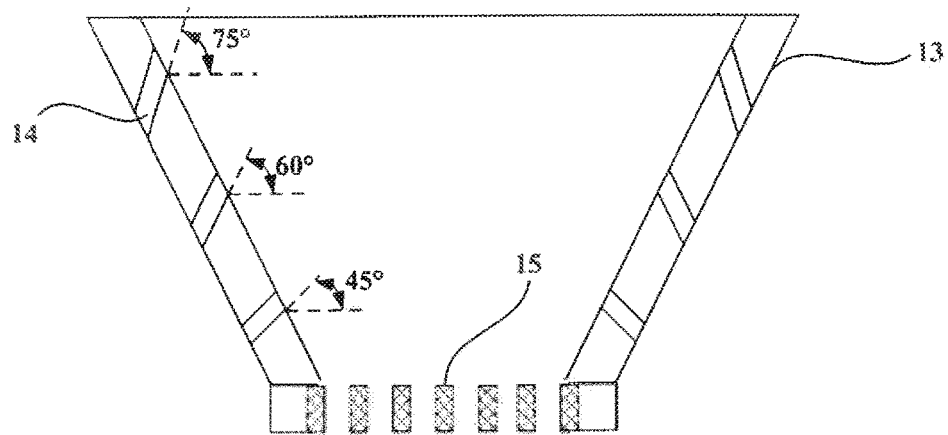
FIG. 2 is a schematic diagram of a longitudinal section of a fluid guide member of the evaporation crucible in the embodiment of the present disclosure.
Figure 3:
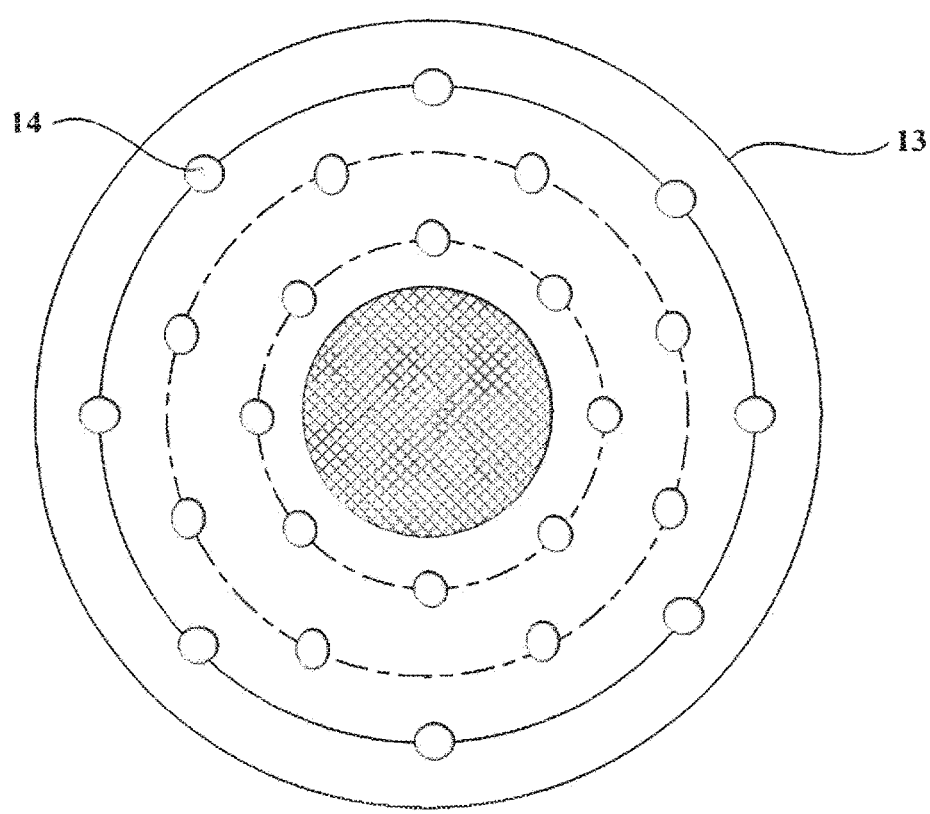
FIG. 3 is a top view of the fluid guide member of the evaporation crucible in the embodiment of the present disclosure.

As shown in FIG. 2 and FIG. 3, in the embodiment of the present disclosure, the plurality of inert gas inlet nozzles 14 are arranged in at least two layers along a height direction. For example, the inert gas inlet nozzles 14 in each layer are horizontally and annularly distributed. In this way, action of inert gas flow on the evaporation gas molecules in the fluid guide member 13 is uniform so that the evaporation efficiency and evaporation quality can be further improved.

As shown in FIG. 2, for example, the inert gas inlet nozzles of each layer have a same injection angle with respect to a horizontal plane. The angle between the inert gas inlet nozzles in a higher layer and a horizontal direction are greater than that between the inert gas inlet nozzles in a lower layer and the horizontal direction. That is, the injection angle, with respect to the horizontal plane, of the inert gas inlet nozzles in the higher layer is greater than that of the inert gas inlet nozzles in the lower layer. Herein, as for one inert gas inlet nozzle, the injection angle with respect to a horizontal plane means the angle between the main injection direction (for example, the central injection direction) of the one inert gas inlet nozzle and the horizontal plane.

The closer to the top of the fluid guide member the evaporation gas molecules in the fluid guide member are, the greater the rate loss is, and the greater a possibility that the evaporation gas molecules fly and overflow to other directions except the substrate is. In the embodiment, for example, in order to overcome such technical defects, the angles between the inert gas inlet nozzles 14 and the horizontal direction (for example, the horizontal plane) are designed to increase in a stepwise manner from bottom to top, so that boosting force of the inert gas flow on the evaporation gas molecules is increased sequentially, and therefore the movement direction of the evaporation gas molecules can be effectively adjusted, flying and overflowing loss of the evaporation gas molecules is reduced, and the evaporation material utilizing rate and the evaporation efficiency are further improved.

For example, in the embodiment shown in FIG. 2, the plurality of inert gas inlet nozzles are arranged in three layers along a height direction. The angles between the inert gas inlet nozzles in a bottom layer and the horizontal direction are of 45 degrees; the angles between the inert gas inlet nozzles in a middle layer and a horizontal direction are of 60 degrees, and the angles between the inert gas inlet nozzles in an upper layer and the horizontal direction are of 75 degrees. That is, the injection angles, with respect to the horizontal plane, of the inert gas inlet nozzles in the bottom layer are of 45 degrees, the injection angles, with respect to the horizontal plane, of the inert gas inlet nozzles of the middle layer are of 60 degrees, and the injection angles, with respect to the horizontal plane, of the inert gas inlet nozzles of the upper layer are of 75 degrees.

Please refer to FIG. 1 and FIG. 2, a filter screen 15 is arranged at the bottom of the fluid guide member 13. The filter screen 15 can be used for filtering evaporation gas and preventing overshooting, so that stability of evaporation speed can be easily controlled, a large-block evaporation material is prevented from entering the fluid guide member and flying to the surface of the substrate, and therefore the evaporation quality is guaranteed.

Figure 4:
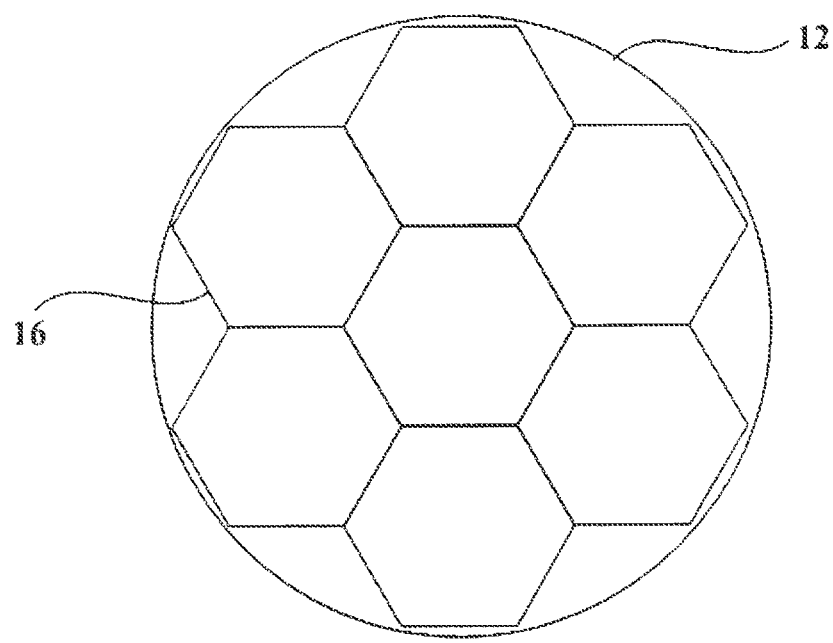
FIG. 4 is a top view of a crucible body of the evaporation crucible in the embodiment of the present disclosure.

Furthermore, as shown in FIG. 1 and FIG. 4, in the embodiment, a honeycomb-shaped heat conductive plate 16 is arranged on the bottom of the crucible body 13. The honeycomb-shaped heat conductive plate 16 can increase a heating area for an evaporation material 300, and therefore heating of the evaporation material can be uniform. By means of this solution, stability of the evaporation speed can be easily controlled, pyrolysis of the evaporation material caused by non-uniform heating is prevented, and the evaporation quality is improved. The honeycomb-shaped heat conductive plate 16 and the crucible body 12 are of a split structure, and the honeycomb-shaped heat conductive plate 16 is placed on the bottom of the crucible body 12. In another embodiment, the honeycomb-shaped heat conductive plate 16 and the bottom of the crucible body 12 are of an integral structure, and in this way, a heat conduction effect of the honeycomb-shaped heat conductive plate 16 and the crucible body 12 can be improved, and therefore heating of the evaporation material can be more uniform, and the evaporation quality is further improved.

Figure 5:
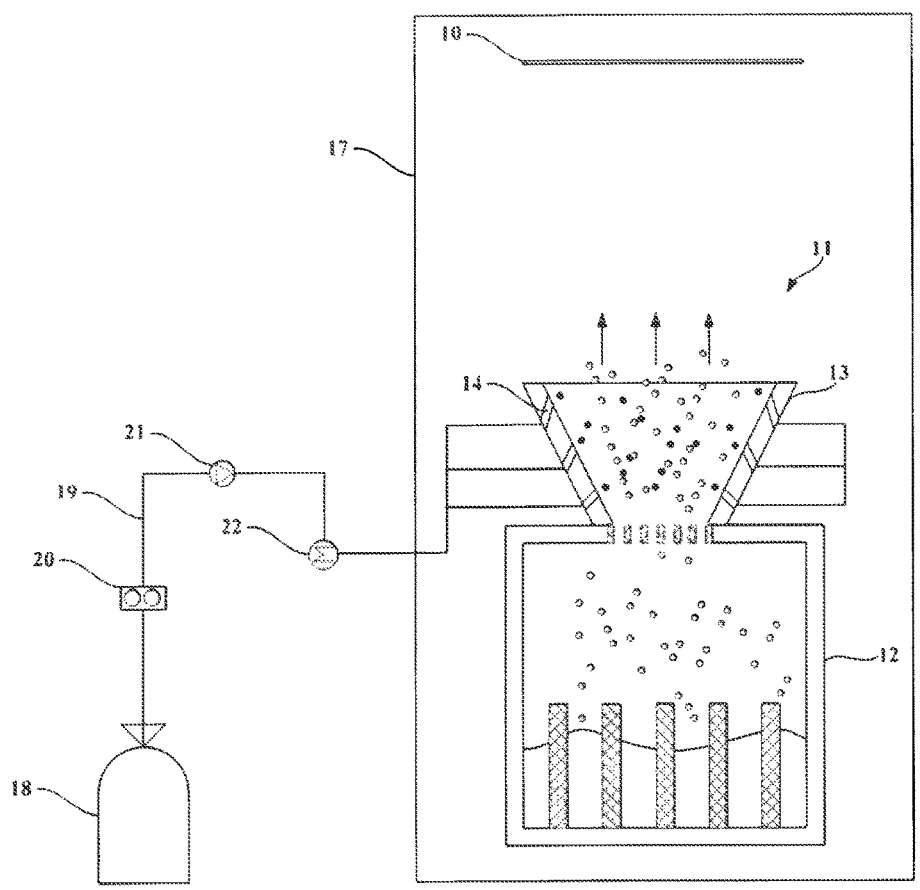
FIG. 5 is a schematic diagram of an evaporation device in an embodiment of the present disclosure.

As shown in FIG. 5, an embodiment of the present disclosure further provides an evaporation device, comprising: an evaporation cavity 17, the evaporation crucible 11 according to any preceding embodiment located in the evaporation cavity 17, and an inert gas tank 18 located outside the evaporation cavity 17. The inert gas tank 18 is communicated with the plurality of inert gas inlet nozzles 14 of the evaporation crucible 11 through a gas pipeline 19.

The inert gas tank 18 of the evaporation device is configured for inletting inert gas into the fluid guide member 13 through the plurality of inert gas inlet nozzles 14, the inert gas molecules can collide with the evaporation gas molecules in the fluid guide member 13, and therefore the kinetic energy for the evaporation gas molecules to move upwards can be increased, and the evaporation gas molecules flying to a surface of a substrate 10 and deposited on the surface of the substrate 10 are greatly increased. By means of this solution, the evaporation material utilizing rate can be improved, and the evaporation efficiency can be improved.

For example, the evaporation device further comprises at least one of a mass flow controller 20, a gas pressurizing pump 21 and a gas heating exchanger 22 located outside the evaporation cavity 17 and connected with the gas pipeline 19 in series.

As shown in FIG. 5, the mass flow controller 20, the gas pressurizing pump 21 and the gas heating exchanger 22 are sequentially connected on the gas pipeline 19 in series between the inert gas tank 18 and the evaporation cavity 17. An end portion of the gas pipeline 19 located in the evaporation cavity 17 is divided into a plurality of branch circuits which are respectively communicated with the plurality of inert gas inlet nozzles 14. The mass flow controller 20 can control flow of the inert gas introduced into the fluid guide member 13, the gas pressurizing pump 21 can control pressure intensity of the inert gas introduced into the fluid guide member 13, and the gas heating exchanger 22 can control temperature of the inert gas introduced into the fluid guide member 13. By means of the evaporation device, state parameters of the inert gas introduced into the fluid guide member 13 can be conveniently adjusted, and therefore the evaporation efficiency and the evaporation quality reach a good level.

In one embodiment of the present disclosure:

The mass flow controller 20 is configured to control flow Q of the inert gas introduced into the fluid guide member to satisfy: $Q=kQ_0$, where $Q_0$ is an evaporation of the evaporation material, k is a proportion coefficient, and $5 \leq k \leq 10$; The flow of the inert gas is controlled within the range, influence on temperature of the substrate can be reduced, and advantageous effects of the present disclosure can be more prominent.

The gas heating exchanger 22 is configured to control a temperature T of the inert gas introduced into the fluid guide member to satisfy: $T_0 - T \leq \Delta T$, where $T_0$ is an evaporation temperature of the evaporation material, $\Delta T$ is a preset temperature difference, and $\Delta T > 0$; For example, the temperature of the inert gas is slightly lower than the evaporation temperature of the evaporation material, and in this way, heat exchange between the inert gas molecules and the evaporation gas molecules in a colliding process can be reduced, and therefore it can be guaranteed that temperature of the evaporation gas molecules meets an evaporation requirement.

The gas pressurizing pump 21 is configured to control a pressure intensity of the inert gas introduced into the fluid guide member, $P > P_0$, where $P_0$ is a pressure intensity of evaporation gas of the evaporation material. Pressure intensity of the inert gas is greater than that of the evaporation gas of the evaporation material, the inert gas molecules have great kinetic energy, and the inert gas molecules can generate obvious boosting force on the evaporation gas molecules.

In summary, the inert gas introduced into the fluid guide member 13 is controlled to meet requirements of the state parameter range, and the evaporation efficiency and the evaporation quality can reach a good level.

It should be noted that in a point source evaporation device, in order to improve evaporation film forming uniformity of a substrate and avoid a case that the substrate is heated to a too-high temperature (in an evaporation process, a short-time tolerable temperature of the substrate can reach 80 degrees Celsius), an interval between the evaporation crucible 11 and the substrate 10 is commonly set to be large. In the evaporation process, the substrate 10 is commonly controlled to horizontally rotate at a constant speed.

A type of the inert gas stored in the inert gas tank 18 is not limited, and the inert gas can be any inert gas. For example, an argon inert gas tank is adopted as the inert gas tank 18. Chemical properties of argon are stable, argon is not likely to react with the evaporation material, argon can be gathered easily, and molecular weight is relatively great. Thus, the argon inert gas tank is adopted as the inert gas tank, argon is introduced into the fluid guide member of the evaporation crucible, and the advantageous effects of the present disclosure can be achieved.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of Chinese Patent Application No. 201510566774.5 filed on Sep. 8, 2015, the present disclosure of which is incorporated herein by reference in its entirety as part of the present application.

The invention claimed is:

1. An evaporation crucible, comprising a crucible body and a fluid guide member communicated with the crucible body, and a plurality of gas inlet nozzles being distributed on a side wall of the fluid guide member wherein, the plurality of gas inlet nozzles are obliquely upwards point to the top of the fluid guide member;

wherein, the plurality of gas inlet nozzles are arranged in at least two layers along a height direction, and the gas inlet nozzles in each layer are horizontally and annularly distributed;

wherein, injection angles, with respect to a horizontal plane, of the gas inlet nozzles in a higher layer are greater than those of the gas inlet nozzles in a lower layer.

2. The evaporation crucible according to claim 1, wherein, the fluid guide member is in a shape of a funnel.

3. The evaporation crucible according to claim 2, wherein, the crucible body has a body opening on a top thereof, the fluid guide member has a first opening on a bottom thereof and a second opening on a top thereof, the second opening is greater than the first opening, and the first opening of the fluid guide member is connected with the crucible body at the body opening.

4. The evaporation crucible according to claim 1, wherein, the crucible body has a body opening on a top thereof, the fluid guide member has a first opening on a bottom thereof and a second opening on a top thereof, second opening being greater than the first opening, and the first opening of the fluid guide member is connected with the crucible body at the body opening.

5. The evaporation crucible according to claim 1, wherein, the gas inlet nozzles in each layer have a same injection angle with respect to a horizontal plane.

6. The evaporation crucible according to claim 5, wherein, the plurality of inert gas inlet nozzles are arranged in three layers along a height direction, the injection angles, with respect to the horizontal plane, of the inert gas inlet nozzles in a bottom layer are of 45 degrees, the injection angles, with respect to the horizontal plane, of the gas inlet nozzles in a middle layer are of 60 degrees, and the injection angles, with respect to the horizontal plane, of the gas inlet nozzles in an upper layer are of 75 degrees.

7. The evaporation crucible according to claim 1, wherein, a filter screen is arranged at a bottom of the fluid guide member.

8. The evaporation crucible according to claim 1, wherein, a honeycomb-shaped heat conduction plate is arranged on a bottom of the crucible body.

9. The evaporation crucible according to claim 8, wherein, the honeycomb-shaped heat conduction plate and the bottom of the crucible body are of an integral structure.

10. The evaporation crucible according to claim 1, wherein, the plurality of gas inlet nozzles are configured to spray inert gas into the fluid guide member.

11. An evaporation device, comprising: an evaporation cavity, the evaporation crucible according to claim 1 which is located in the evaporation cavity, and an inert gas tank located outside the evaporation cavity, wherein, the inert gas tank is communicated with the plurality of inert gas inlet nozzles of the evaporation crucible through a gas pipeline.

12. The evaporation device according to claim 11, further comprising at least one of a mass flow controller, a gas pressurizing pump and a gas heating exchanger located outside the evaporation cavity and connected to the gas pipeline in series.

13. The evaporation device according to claim 12, wherein, the evaporation device comprises the mass flow controller, the gas pressurizing pump and the gas heating exchanger connected in series on the gas pipeline, wherein, the mass flow controller is configured to control flow Q of inert gas introduced into the fluid guide member to satisfy: $Q=kQ_0$, where $Q_0$ is an evaporation of an evaporation material, k is a proportion coefficient, and $5 \leq k \leq 10$;

the gas heating exchanger is configured to control a temperature T of the inert gas introduced into the fluid guide member to satisfy: $T_0 - T \leq \Delta T$, where $T_0$ is an evaporation temperature of the evaporation material, $\Delta T$ is a preset temperature difference, and $\Delta T > 0$; and the gas pressurizing pump is configured to control a pressure intensity of the inert gas introduced into the fluid guide member to satisfy: $P > P_0$, where $P_0$ is a pressure intensity of evaporation gas of the evaporation material.

14. The evaporation device according to claim 11, wherein, the inert gas tank includes an argon inert gas tank.

15. The evaporation crucible according to claim 1, wherein, the gas inlet nozzles in each layer have a same injection angle with respect to a horizontal plane.

\* \* \* \* \*